United States Patent [19]

Chambers

[11] Patent Number: 4,581,678
[45] Date of Patent: Apr. 8, 1986

[54] CIRCUIT COMPONENT ASSEMBLIES

[75] Inventor: Jeffrey Chambers, Ulverston, England

[73] Assignee: Oxley Developments Company Limited, London, England

[21] Appl. No.: 588,728

[22] Filed: Mar. 12, 1984

[30] Foreign Application Priority Data

Mar. 16, 1983 [GB] United Kingdom ............... 8307231

[51] Int. Cl.$^4$ ............................................. H02B 1/04
[52] U.S. Cl. ..................................... 361/331; 29/840; 333/185; 339/17 C; 361/420
[58] Field of Search .................... 333/181-184; 339/17 C, 198 P, 213 R, 219 R, 223 R; 361/331, 380, 396, 400, 401, 412, 414, 417-419, 420, 424; 206/329, 443; 29/832, 836, 840

[56] References Cited

U.S. PATENT DOCUMENTS

| | | | |
|---|---|---|---|
| 2,596,237 | 5/1952 | Gross et al. ........................ | 361/331 |
| 2,962,154 | 11/1960 | Falk .................................... | 206/379 |
| 4,262,268 | 4/1981 | Shimada et al. .................. | 333/182 |
| 4,449,769 | 5/1984 | Kobayashi et al. ................ | 361/414 |

FOREIGN PATENT DOCUMENTS 2081974 11/1981 United Kingdom ........... 174/52 PE

OTHER PUBLICATIONS

Melngailis et al. "Analysis of Through-Channel and Cross-Channel Insertion Loss in Ferrite-Wall Multiple-Circuit Feedthrough Capacitors", 5/59, pp. 11-17.

Primary Examiner—A. D. Pellinen
Assistant Examiner—Gregory P. Thompson
Attorney, Agent, or Firm—Gipple & Hale

[57] ABSTRACT

In an assembly of circuit components, such as a multiplicity of RF interference suppression filters, the filter elements (15) in a first array are secured to a first plate (16) at solder joints (17) and further filter elements (18) in a second array are secured to a second flat plate (19) at solder joints (20). The first array of filter elements (15) thus extend through apertures (21b) in the second plate (19) and the second array of filter elements (18) extend through apertures (21a) in the first plate (16). The plates (16) and (19) are secured together after the soldering operation and the interspersed arrays of filter elements (15) and (18) can be individually inspected as to the adequacy of the solder joint.

11 Claims, 6 Drawing Figures

CIRCUIT COMPONENT ASSEMBLIES

BACKGROUND OF THE INVENTION

The present invention is concerned with circuit component assemblies in which the components are arranged in an array. The invention is useful in the case of a multiplicity of radio frequency interference (rfi) suppression filters.

During the transmission of electrical power and data along both shielded and unshielded cables, it is commonly found that unwanted 'interference' currents and voltages are present in addition to the power or data. The interference signals thus cause degradation of the power or data, which may be large enough in many cases to cause a malfunction of an electrical circuit, or to simply mask the data.

This becomes a particularly serious effect in, for example, high integrity telecommunications systems, computer and industrial control systems and military and civil communications systems within aircraft, warships etc.

To achieve correct operation of circuitry, it is necessary to provide electrical filtering to remove undesirable interference. Filtering may be carried out at the parts to a particular piece of equipment, or sub-assembly where interference-free power or data is required. Thus a 'clean' area is created within the assembly, separated from the 'dirty' environment by the electrical filters.

To allow resonance-free operation up to microwave frequencies, a coaxial construction is utilised which minimizes the self-inductance of the assembly.

Filters may be of single capacitor form, pi-section, L-C section or T-section.

The increasing demands of miniaturization of components and equipment frequently severely limit the space available for mounting components, such as rfi suppression filters.

In addition many power lines, data line, earth returns etc. are commonly needed in each assembly or sub-equipment and the number may exceed on hundred.

As a consequence, it is often necessary to mount many rfi suppression filters in a close-packed configuration, which may be known as a filter array.

The filter array may be in a rectangular or circular form. If the former, a typical pitch between filter centers may be 0.100" (2.54 mm), with adjacent rows staggered to fit within the adjoining interstices. The filter array is thus an assembly of rfi suppression filters to a convenient sub-chassis or plate, conductive in nature, which is fixed in some convenient way to the chassis of the unit which is to be fed with interference-free power or data.

Connections to the filter array may be made by any of the conventional electrical connector techniques, for example direct soldering, crimp, wire-wrap or for electrical and mechanical connection by direct plugging into a suitable receptacle and could effectively form a backplate to a multiway connector.

On assembly of the filter, the space between adjacent filters becomes restricted when the pitch between filter centers is small, for example only 0.100" (2.54 mm). This is due to limitations on the tubular ceramic technology which provides the filter elements and also the need in pi-filters to include a coaxial ferrite inductive element. Thus there are minimum outside diameter limitations on the filter elements. Thus the outside diameter may need to be as much as 0.090" (2.39 mm).

Clearly, a close-packed filter array, employing such tubular elements, which could be typically 8 mm long, causes severe problems of visual inspection of solder joint quality.

It is an object of the present invention to provide a method of assembling a filter array in such a manner as to allow clear inspection of the finished solder joint.

According to the present invention, an assembly of circuit components for electrical circuitry comprises at least two plates, each having thereon a respective part-array of components and having apertures interspersed between such components, the plates being arranged side-by-side with the components on each plate extending through the apertures in the other plate or plates, whereby the part-arrays of components complement each other to form a completed array.

The apertures in each plate increase the spacing between the individual components of the part-array on that plate, thereby facilitating inspection of the joints between the components and the plates before the plates are assembled together.

Preferably, the plates are spaced apart slightly by the use of shims. The plates are advantageously secured to one another, preferably at their rims, to form a composite sub-chassis.

In a method of making an assembly of circuit components according to the invention, at least two plates are provided, each having apertures therein corresponding to a desired array, circuit components are inserted in some of the apertures in each plate and are secured thereto to form a respective sub-array in which the components are spaced apart by unoccupied apertures, and thereafter the plates are placed in side-by-side relationship with the components on each plate received in the unoccupied apertures in the other plate or plates.

While the use of two plates in a single assembly substantially eases inspection problems, more than two plates may readily be used to further facilitate inspection. Thus three plates could readily be interleaved, using two spacing shims as required. This would further reduce the density of components, thus further easing the inspection methods.

Furthermore, it may be shown statistically that the fewer components are assembled at any one time, for a given failure rate, the chances of success in assembly are greatly increased.

Thus, this technique of component array assembly using several plates provides for an increased quality level.

A further technique in the assembly of a filter array lies in the solder used both in the filter elements and in the assembly of the arrays themselves. Thus, where a soldered electrical connection must be made between the ceramic filter elements themselves and a feed-through wire, it becomes important to use a solder of lower melting point during the attachment of filter elements to the conductive plate, to avoid the filter elements collapsing due to re-melting of the first solder joints. Any combination of solders providing this hierarcy of melting points may be suitable (providing they are suitable in other respects). For example, high melting point solder (melting point ~300° C.) may be used during filter element assembly, followed by a low melting point solder (melting point ~180° C.) during the array assembly.

Thus, according to another aspect of the invention, an assembly of circuit components for electrical circuitry comprises a plate to which the components are secured by solder, at least some of the components having lead wires soldered thereto by means of a solder having a substantially higher softening point than the solder by which the components are soldered to the plate.

The invention is further described, by way of example, with reference to the accompanying drawings, in which:

DETAILED DESCRIPTION OF THE DRAWINGS

Figure 1:
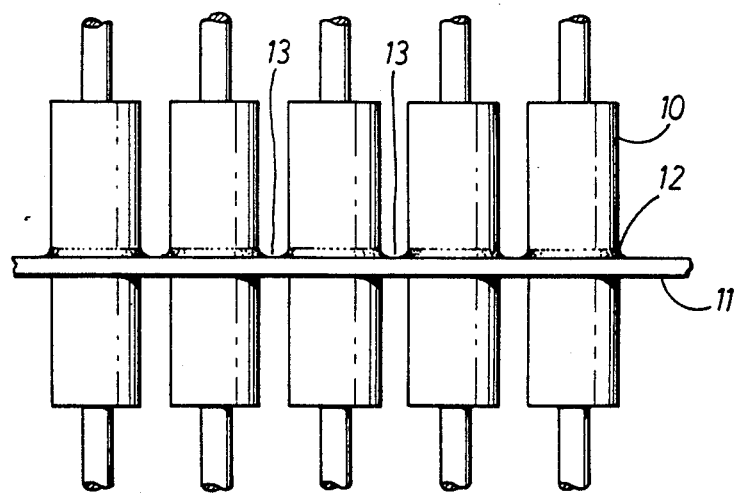
FIG. 1 is a side elevation of part of a filter array according to the state of the art.
Figure 2:
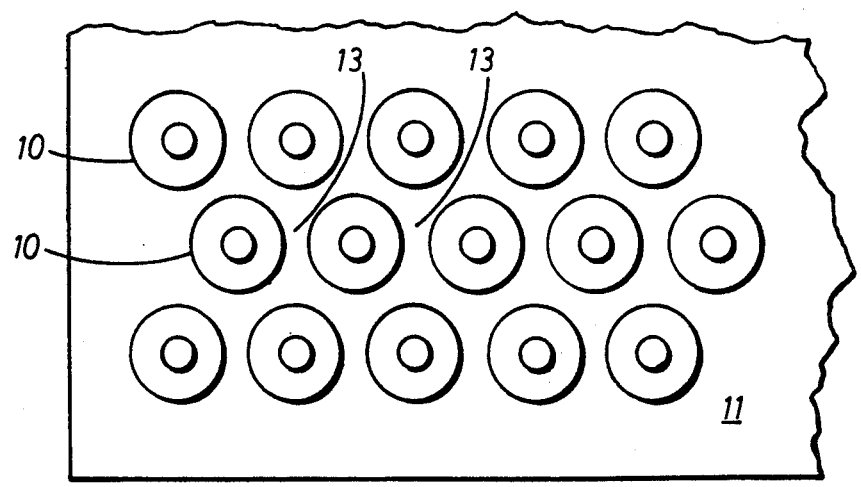
FIG. 2 is a plan view of the part of the filter array of FIG. 1.

Referring first to FIGS. 1 and 2, a multiplicity of cylindrical filter elements 10 are secured to a solderable plate 11 for grounding purposes to form an array, a fragment of which is shown. The solder joints are shown at 12 in FIG. 1. It can be seen that the interstices 13, particularly those away from the edge of the array, are very small so that it is difficult to inspect the solder joints to check that they have been effected properly.

Figure 3:
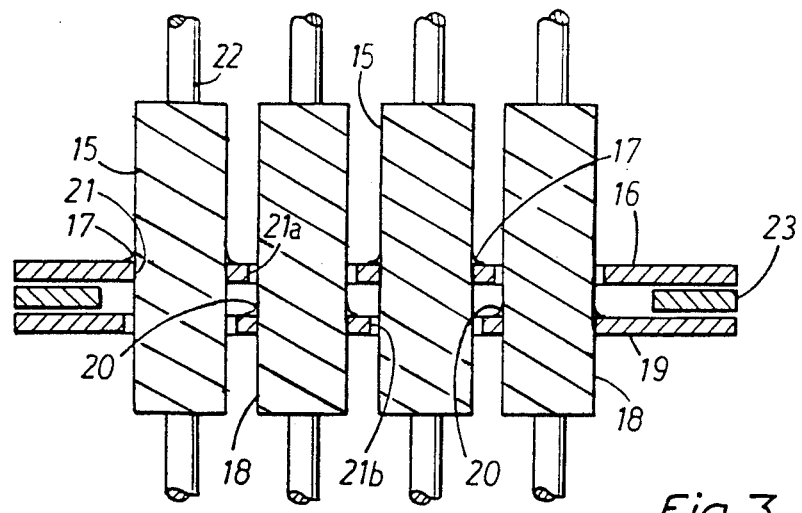
FIG. 3 is a sectional elevation of a filter array according to the present invention.

In the preferred embodiment and best mode of the invention of the assembly shown in FIG. 3, some filter elements 15 are secured to a first flat plate 16 by solder joints 17 for grounding purposes and the remaining filter elements 18 are secured to a second flat plate 19 at solder joints 20. Each of the plates 16 and 19 has a complete array of apertures 21 and the filter elements extend through respective apertures in the respective plate so that the feed-through wires 22 extend to both sides of the plate.

Figure 4:
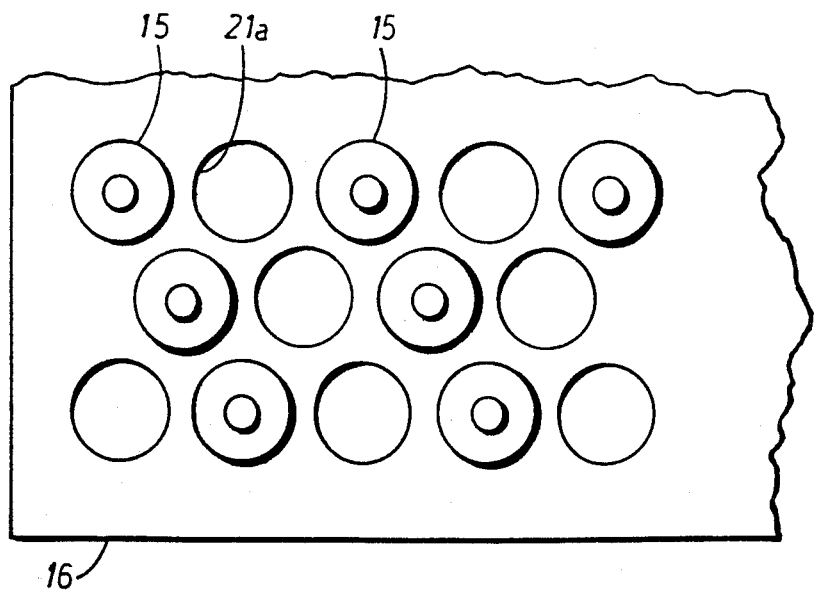
FIG. 4 is a plan view of part of one of the subassemblies of the filter array of FIG. 3.
Figure 5:
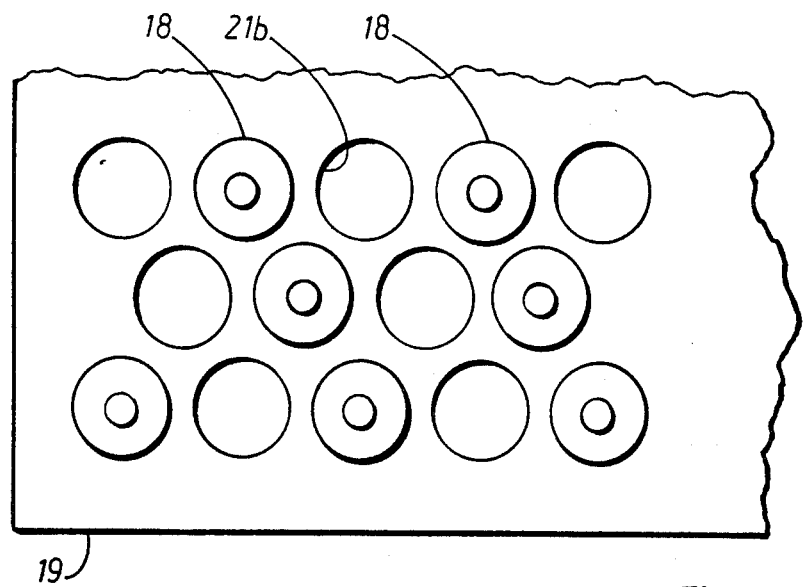
FIG. 5 is a plan view of the other sub-assembly.

As can be seen from FIGS. 4 and 5, the filter elements 15 on the plate 16 are spaced apart by unoccupied apertures 21a and the filter elements 18 on the plate 19 are spaced apart by unoccupied apertures 21b. This wider spacing between the filter elements in the sub-assemblies shown in FIGS. 4 and 5 facilitates visual inspection of the solder joints 17 and 20 prior to completion of the assembly. It can also be seen from FIGS. 4 and 5 that the filter elements 15 form a first part-array and that the filter elements 18 form a second part-array and that these two part-arrays complement one another. Thus, when the plates are placed together in parallel side-by-side relationship as shown in FIG. 3, the filter elements 15 on the plate 16 extend through the unoccupied apertures 21b in the plate 19 and the filter elements 18 on the plate 19 extend through the unoccupied apertures 21a in the plate 16.

It can also be seen in FIG. 3 that the solder joints 17 and 20 are arranged at slightly different levels on the filter elements 15 and 18 so that the ends of the filter elements can lie in common planes.

It is preferable for the plates 16 and 19 to be spaced apart slightly in order to allow for the height of the solder menisci. This spacing can be achieved by means of shims 23 arranged between the plates 16 and 19. The two plates 16 and 19 may be secured to one another at their peripheries, for example, by mechanical clamping or spot welding so that the two plates together form a sub-chassis.

In the case of three plates, each plate would have two unoccupied apertures for each aperture occupied by a filter element soldered to that plate. In this case the three sub-arrays of filter elements formed on the respective plates would complement each other, so that the filter elements secured to one plate would extend through unoccupied apertures in the other two plates. Such a measure further increases the spacing between individual filter elements on a given plate, thereby further easing inspection methods.

Figure 6:
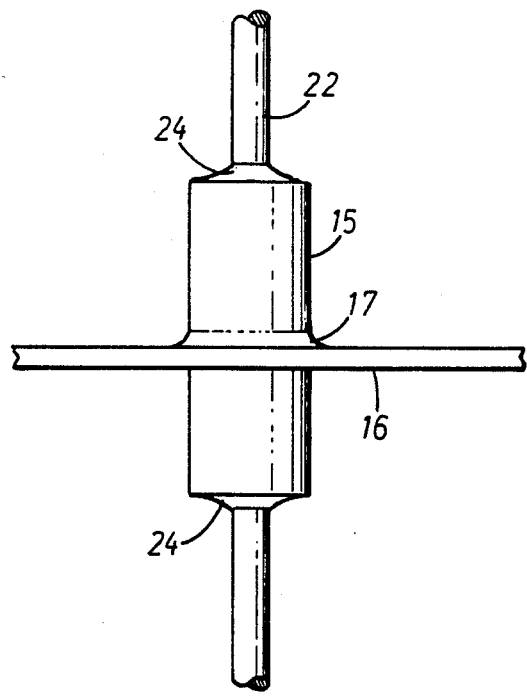
FIG. 6 is an enlarged fragmentary elevation of one of the filter elements of the filter array according to the invention.

FIG. 6 shows a filter element 15 secured to the plate 16 at the solder joint 17. This Figure also shows a feed-through wire 22 secured at a further solder joint 24 to the ceramic filter element. The solder of the joint 24 has a higher melting point than the solder at the joint 17 so that the solder at the joint 24 is not melted again when soldering the filter elements to the filter plates.

I claim:

1. An assembly of circuit components for electrical circuitry comprising at least two adjacent plates, each plate having mounted thereon a respective part-array of components and each plate defining spacing apertures interspersed among said part-array of components mounted to said plate, said plates being arranged side-by-side with said part-array of components on each plate extending through the spacing apertures in, but not attached to, the other adjacent plate to form a completed array and the plates being secured together.

2. An assembly according to claim 1, in which the plates are spaced apart slightly by shims.

3. An assembly according to claim 1, in which the plates are secured to one another to form a composite sub-chassis.

4. An assembly according to claim 1, wherein each respective plate has secured thereon said respective part-array of components by soldering.

5. An assembly according to claim 1, in which said circuit components comprise filter elements.

6. A method of making an assembly of circuit components comprising the steps of providing at least a first and a second plate, each with apertures therein corresponding to a desired array, inserting first circuit components in a first sub-array of the apertures in said first plate leaving a second sub-array of said apertures interspersed among said first circuit components and securing the first circuit components to said first plate, inserting second circuit components in the second sub-array of the apertures in said second plate leaving the first sub-array of said apertures interspersed among said second circuit components and securing the second circuit components to said second plate, placing the plates in side-by-side relationship with the first circuit components secured to the first plate received in the first sub-array of apertures in the second plate and the second circuit components secured to the second plate received in the second sub-array of apertures in the first plate, and securing said plates together.

7. A method according to claim 6, in which said first circuit components are soldered to said first sub-array of apertures in said first plate and said second circuit components are soldered to said second sub-array of apertures in said second plate.

8. A method according to claim 7, further comprising the initial step of soldering each said first and second circuit components to respective feed-through wires with a higher melting point solder, and in which said first and second circuit components are soldered to the respective first and second plates by means of a lower melting point solder.

9. A method according to claim 6, in which said circuit components comprise filter elements.

10. An assembly of circuit components for electrical circuitry comprising at least first and second planar plates, said plates being mounted adjacent and parallel to each other, each of said plates defining a plurality of apertures, a first plurality of component means fixed to said first plate mounted in a first subset of said defined apertures in said first plate, a second plurality of component means fixed to said second plate mounted in a second subset of said apertures defined in said second plate, said first plurality of components extending through unoccupied apertures of said second plate interspersed among said second plurality of components, said first plurality of components being unattached to said second plate, said second plurality of components extending through unoccupied apertures of said first plate interspersed among said first plurality of components, shim means mounted between said plates to space said plates and means to secure said plates together.

11. An assembly of circuit components for electrical circuitry as claimed in claim 10 wherein the component means are secured to said plates by solder, said component means being provided with lead wires soldered thereto, said solder for said lead wire having a substantially higher softening point than the solder by which the components are soldered to the plate.

* * * * *